US012622305B2

(12) United States Patent
Ji

(10) Patent No.: US 12,622,305 B2
(45) Date of Patent: May 5, 2026

(54) BUMP WITH STEPPED PASSIVATION STRUCTURE WITH VARYING STEP HEIGHTS

(71) Applicant: ChangXin Memory Technologies, Inc., Hefei City (CN)

(72) Inventor: Hongkai Ji, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 375 days.

(21) Appl. No.: 18/547,853

(22) PCT Filed: Mar. 13, 2023

(86) PCT No.: PCT/CN2023/081157
§ 371 (c)(1),
(2) Date: Aug. 24, 2023

(87) PCT Pub. No.: WO2024/066221
PCT Pub. Date: Apr. 4, 2024

(65) Prior Publication Data
US 2025/0015035 A1     Jan. 9, 2025

(30) Foreign Application Priority Data
Sep. 30, 2022    (CN) .......................... 202211215119.1

(51) Int. Cl.
H01L 23/498 (2006.01)
H01L 23/00 (2006.01)
(Continued)

(52) U.S. Cl.
CPC ......... H10W 72/20 (2026.01); H10W 72/072 (2026.01); H10W 72/07331 (2026.01);
(Continued)

(58) Field of Classification Search
CPC ... H01L 24/11–27; H01L 24/75; H01L 24/80; H01L 24/81; H01L 21/50;
(Continued)

(56) References Cited

U.S. PATENT DOCUMENTS

| | | | | |
|---|---|---|---|---|
| 9,691,703 B2 * | 6/2017 | Wang | ................... | H01L 23/3192 |
| 2002/0014703 A1 * | 2/2002 | Capote | .................... | H01L 24/29 |
| | | | | 257/E21.511 |

(Continued)

FOREIGN PATENT DOCUMENTS

| | | |
|---|---|---|
| CN | 100446232 C | 12/2008 |
| CN | 101399246 B | 12/2011 |

(Continued)

OTHER PUBLICATIONS

PCT/CN2023/081157 International Search Report mailed Apr. 28, 2023.

*Primary Examiner* — Wael M Fahmy
*Assistant Examiner* — Aneesa Riaz Baig
(74) *Attorney, Agent, or Firm* — Syncoda LLC; Feng Ma

(57) ABSTRACT

A semiconductor structure and a method of fabricating the semiconductor structure are disclosed. The semiconductor structure includes: a carrying layer, a barrier layer, a solder layer and an adhesive layer. The barrier layer is located on the surface of the carrying layer, and there are openings in the barrier layer. The barrier layer includes multiple sub-barrier layers in a stack. The multiple sub-barrier layers respectively form a plurality of steps in the opening, and the heights of the plurality of steps decrease sequentially in a direction from outside of the opening to inside of the opening. A solder layer and an adhesive layer are located in the opening, and the adhesive layer covers the solder layer.

12 Claims, 10 Drawing Sheets

(51) Int. Cl.

| | |
|---|---|
| *H10D 1/60* | (2025.01) |
| *H10W 72/00* | (2026.01) |
| *H10W 72/20* | (2026.01) |
| *H10W 72/30* | (2026.01) |
| *H10W 74/15* | (2026.01) |
| *H10W 90/00* | (2026.01) |
| *H10W 99/00* | (2026.01) |

(52) U.S. Cl.
CPC ......... *H10W 72/30* (2026.01); *H10W 72/851* (2026.01); *H10W 72/012* (2026.01); *H10W 72/07232* (2026.01); *H10W 72/073* (2026.01); *H10W 72/287* (2026.01); *H10W 74/15* (2026.01); *H10W 90/721* (2026.01); *H10W 90/722* (2026.01); *H10W 90/731* (2026.01); *H10W 90/732* (2026.01); *H10W 99/00* (2026.01)

(58) Field of Classification Search
CPC . H01L 2021/60007; H01L 2021/60022; H01L 2224/11003; H01L 2224/11005; H01L 2224/11334; H01L 2224/48463; H01L 2224/10175; H10P 14/662–668; H10W 70/60; H10W 70/05; H10W 72/20; H10W 72/072; H10W 72/30; H10W 72/851; H10W 72/012; H10W 72/07232; H10W 72/073; H10W 72/07331; H10W 72/287; H10W 74/15; H10W 90/721; H10W 90/722; H10W 90/731; H10W 90/732; H10W 70/65; H10W 90/724; H10W 90/734

See application file for complete search history.

(56) References Cited

U.S. PATENT DOCUMENTS

| | | | |
|---|---|---|---|
| 2012/0188735 A1* | 7/2012 | Hiroshima ............... | H05K 1/18 361/767 |
| 2022/0262750 A1* | 8/2022 | Wu ......................... | H01L 21/48 |
| 2024/0038703 A1* | 2/2024 | Li ..................... | H01L 23/49894 |

FOREIGN PATENT DOCUMENTS

| | | | | |
|---|---|---|---|---|
| CN | 102612255 A | | 7/2012 | |
| CN | 113972182 A | * | 1/2022 | ......... H01L 23/4922 |
| CN | 113972183 A | | 1/2022 | |
| JP | H06350230 A | | 12/1994 | |
| JP | 2006-202881 A | | 8/2006 | |
| WO | WO 2010/100706 A1 | | 9/2010 | |

* cited by examiner

BUMP WITH STEPPED PASSIVATION STRUCTURE WITH VARYING STEP HEIGHTS

CROSS REFERENCES TO RELATED APPLICATIONS

This application claims the benefit of priority of Chinese patent application filed on Sep. 30, 2022, entitled "A SEMI-CONDUCTOR STRUCTURE AND METHOD MAKING THE SAME", with the application number 202211215119.1, the contents of which are incorporated herein by reference in its entirety.

TECHNICAL FIELD

The present disclosure belongs to the field of semiconductors, and in particular relates to a semiconductor structure and a method for manufacturing the semiconductor structure.

BACKGROUND

During the packaging process of the semiconductor structure, a solder layer is usually used to make the electrical connection between the chip and the carrier layer; however, the solder layer may deform or flow, thereby causing defects such as short circuits in the semiconductor structures. Short circuits can render semiconductor structures useless. Therefore, there is an urgent need for a semiconductor structure and a method for manufacturing the semiconductor structure to reduce the risk of defects in the semiconductor structure.

SUMMARY

Embodiments of the present disclosure provide a semiconductor structure and a method for manufacturing the semiconductor structure, reducing the risk of defects in the semiconductor structure.

According to some embodiments of the present disclosure, an embodiment of the present disclosure provides a semiconductor structure on the one hand, wherein the semiconductor structure includes: a carrying layer, a barrier layer is provided on the surface of the carrying layer, and an opening is provided in the barrier layer; the barrier layer includes multiple sub-barrier layers stacked, and the multiple sub-barrier layers respectively form a plurality of steps at the opening, and in the direction from the outside of the opening to the inside of the opening, a plurality of the sub-barrier layers; the height of the steps decreases successively; there is a solder layer and an adhesive layer inside the opening, and the adhesive layer covers the solder layer.

According to some embodiments of the present disclosure, on the other hand, embodiments of the present disclosure also provide a method for manufacturing a semiconductor structure, the method for manufacturing a semiconductor structure includes: providing a carrying layer; forming a barrier layer on the surface of the carrying layer, there is an opening in the barrier layer; the barrier layer includes multiple sub-barrier layers stacked, and the multiple sub-barrier layers form a plurality of steps at the opening, and point to the opening inside the opening In the external direction, the heights of the plurality of steps decrease sequentially; a solder layer is formed in the opening; and an adhesive layer covering the solder layer is formed in the opening.

The technical scheme that the embodiment of the present disclosure provides at least has the following advantages:

The surface of the carrying layer has a barrier layer, and an opening is provided in the barrier layer, and a solder layer and an adhesive layer are arranged in the opening; the multiple sub-barrier layer constitutes a step at the opening. This step can reduce the fluidity of the adhesive layer, thereby preventing the adhesive layer from rushing the solder layer out of the opening during the flow process. In addition, the steps can also guide the adhesive layer, so that the adhesive layer flows to the bottom of the opening during the filling process, thereby increasing the density of the adhesive layer and reducing the pores in the adhesive layer.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

DETAILED DESCRIPTION OF THE PREFERRED EMBODIMENTS

Figure 1:
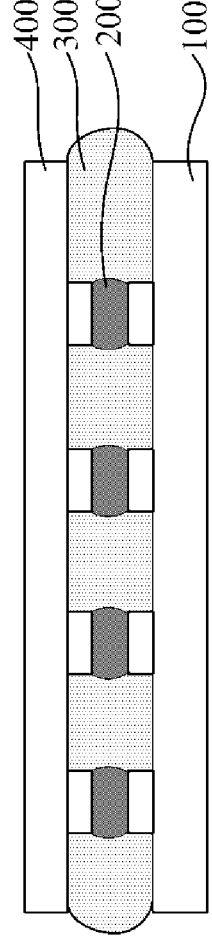
FIG. 1 shows the cross-sectional view of a semiconductor structure.
Figure 2:
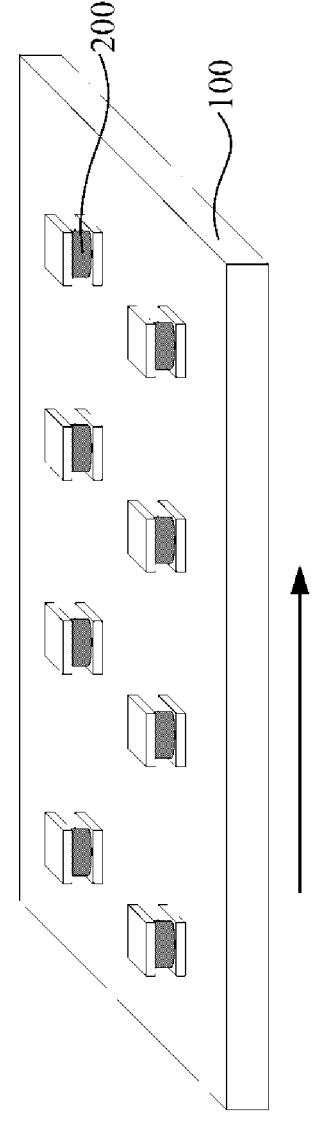
FIG. 2 shows a schematic diagram of a semiconductor structure during thermocompression bonding.
Figure 3:
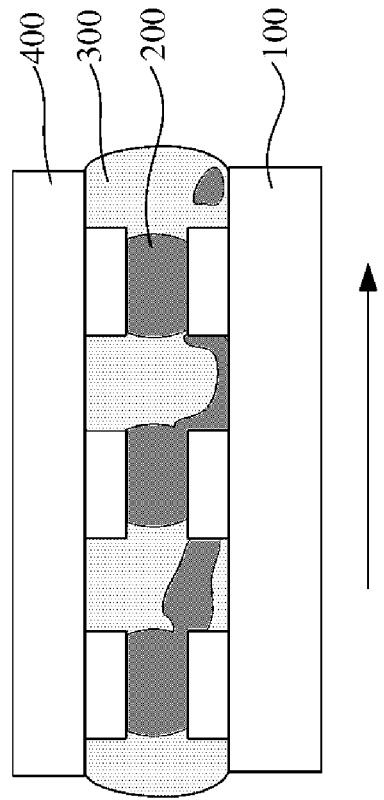
FIG. 3 shows an enlarged cross-sectional view of a semiconductor structure after thermocompression bonding.

Referring to FIG. 1, when semiconductor structures are stacked three-dimensionally, thermal compression bonding (TCB) technology is usually used. In TCB, a chip 400 is bonded to the carrier layer 100 under pressure and temperature conditions. In addition, the adhesive layer 300 needs to be filled between the chip 400 and the carrier layer 100. The adhesive layer 300 is also located in the gap between the adjacent solder layers 200, thereby increasing the bonding strength and improving the package reliability. Referring to FIG. 2, after the adhesive layer 300 is raised to a certain temperature, its viscosity decreases and becomes fluid; in addition, during the TCB process, the solder will melt due to the temperature rise. Referring to FIG. 3, since there is no barrier structure between adjacent solder layers 200, as the adhesive layer 300 flows, the melted solder in the solder layer 200 will be washed away by the adhesive layer 300 and brought to other solder layers. 200, or is brought to a position in the middle of adjacent solder layers 200, thereby increasing the risk of short circuits. Arrows in FIGS. 2 and 3 are used to indicate the flow position of the adhesive layer 300.

An embodiment of the present disclosure provides a semiconductor structure, a barrier layer is provided on the surface of the carrying layer, and the solder layer and the adhesive layer can be located in the opening of the barrier layer. The multiple sub-barrier layer forms a step at the opening, and the step can reduce the fluidity of the adhesive layer, and it is difficult for melted solder to flow across the step, thereby increasing the reliability in the TCB process. In addition, the steps can also guide the flow direction of the adhesive layer to reduce pores in the adhesive layer in the opening, thereby enhancing the structural strength and improving the reliability of the package.

Various embodiments of the present disclosure will be described in detail below in conjunction with the accompanying drawings. However, those of ordinary skill in the art can understand that, in each embodiment of the present disclosure, many technical details are provided for readers to better understand the embodiments of the present disclosure. However, even without these technical details and various changes and modifications based on the following embodiments, the technical solutions claimed in the embodiments of the present disclosure can be realized.

As shown in FIG. 4- FIG. 10, an embodiment of the present disclosure provides a kind of semiconductor structure, and semiconductor structure comprises: carrier layer 1, the surface of carrier layer 1 has barrier layer 4, has opening 42 in barrier layer 4; a barrier Layer 4 includes stacked multiple sub-barrier layers 41. The multiple sub-barrier layers 41 respectively form a plurality of steps 43 at the opening 42, and in the direction from the outside of the opening 42 to the inside of the opening 42, the heights of the plurality of steps 43 are sequentially lowering; there is a solder layer 2 and an adhesive layer 3 inside the opening 42, and the adhesive layer 3 covers the solder layer 2.

Such design has the following advantages at least:

First, adjacent solder layers 2 are separated by a barrier layer 4. The barrier layer 4 has an insulating effect, which can isolate the adjacent solder layer 2 and reduce the risk of short circuit.

Second, in the direction from the outside of the opening 42 to the inside of the opening 42, the heights of the plurality of steps 43 decrease sequentially. That is, the size of the top of the opening 42 is greater than the size of the bottom of the opening 42. The larger size of the top of the opening 42 can facilitate the formation of the solder layer 2 in the opening 42, and facilitate the alignment process before thermocompression bonding; the smaller size of the bottom of the opening 42 is conducive to improving the filling effect of the adhesive layer 3 and reducing holes. Formation. The reduction of holes is beneficial to improve the strength and heat dissipation performance of the semiconductor structure.

The third, the sidewall of each step 43 can block the adhesive layer 3 and the solder that flow outward to the opening 42, thereby improving the blocking effect; In addition, even if the solder has a tendency to flow from the inside of the opening 42 to the outside of the opening 42, but the upper surface of each step 43 can accommodate solder, thereby preventing the solder from flowing into other openings 42 or between adjacent openings 42; in addition, the steps 43 in the opening 42 can limit the solder function, in order to reduce the solder that is separated from the effective solder joint, so as to avoid reducing the volume of the effective solder joint, and then avoid increasing the resistance of the effective solder joint.

The semiconductor structure will be described in detail below.

Figure 4:
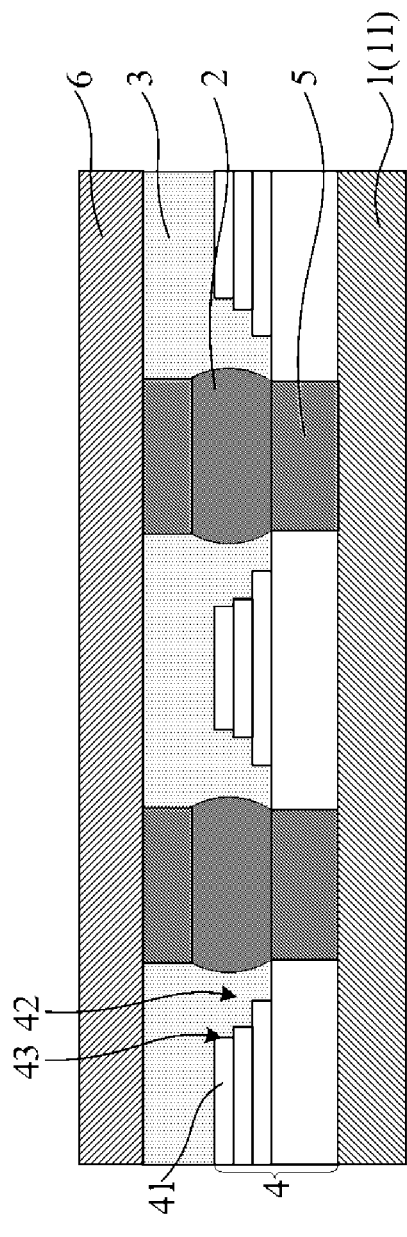
FIG. 4 shows a schematic diagram of a semiconductor structure provided by an embodiment of the present disclosure.
Figure 7:
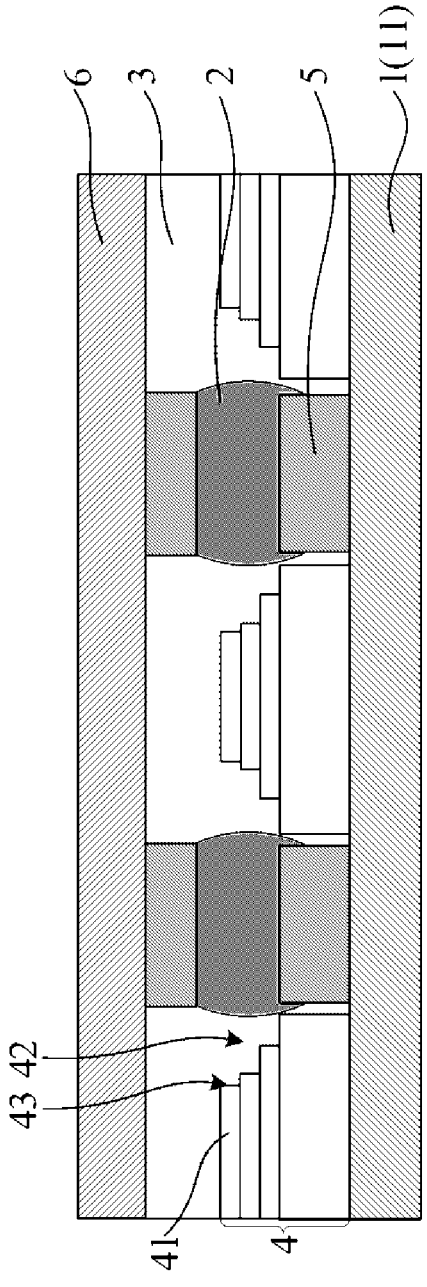
FIG. 7 shows a schematic diagram of another semiconductor structure provided by an embodiment of the present disclosure.
Figure 8:
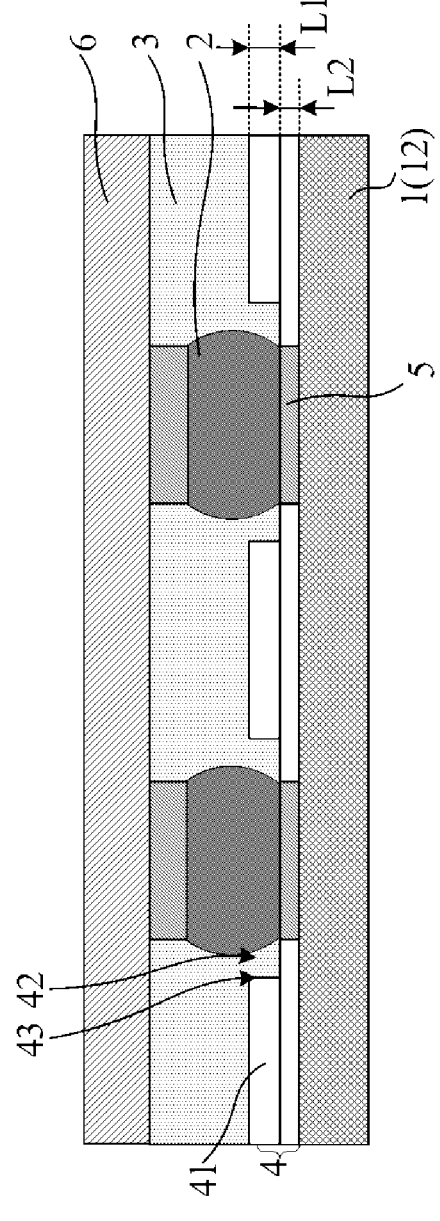
FIG. 8 shows a schematic diagram of another semiconductor structure provided by an embodiment of the present disclosure.

With reference to FIG. 4, FIG. 7- FIG. 8, semiconductor structure also comprises: structural member 6, and structural member 6 is positioned on carrying layer 1, and is electrically connected with solder layer 2, and adhesive layer 3 also fills in structural member 6 and between the load-carrying layers 1. That is, the solder layer 2 is used to realize the electrical connection between the structural member 6 and the carrying layer 1, and the adhesive layer 3 plays a role in improving the structural strength.

Exemplarily, the structural member 6 may be a chip, and this chip is defined as a first chip, and the first chip may be a memory chip, such as a dynamic random access memory (DRAM). That is, the semiconductor structure may be a three dimensional (3D) stacked DRAM. In addition, the first chip may also be a static random-access memory (SRAM). In some other embodiments, the structural member 6 may also be a substrate, such as a second substrate.

In some embodiments, with reference to FIG. 4- FIG. 8, the surface of carrying layer 1 also has soldering pad 5, and soldering pad 5 is positioned at the bottom sub-barrier layer 41, and this soldering pad 5 can be connected with carrying layer 1. The components are electrically connected. The lowest sub-barrier layer 41 can protect the pad 5.

Referring to FIG. 4-FIG. 6 and FIG. 8, in some embodiments, the sidewall of the bottommost sub-barrier layer 41 is attached to the sidewall of the pad 5. Thus, the protective effect of the sub-barrier layer 41 on the pad 5 can be enhanced, and it is beneficial to simplify the process and improve the structural strength.

In some other embodiments, with reference to FIG. 7, the sidewall of the bottom sub-barrier layer 41 can also be spaced from the sidewall of the soldering pad 5, there may be gaps between the bottom sub-barrier layer 41 and the soldering pad 5. Thus, the melted solder can flow toward the sidewall of the pad 5, thereby increasing the wetting area of the solder to the pad 5, thereby reducing the contact resistance. In addition, since this gap can also accommodate solder, the tendency of solder to flow toward the outside of opening 42 can be reduced.

Figure 6:
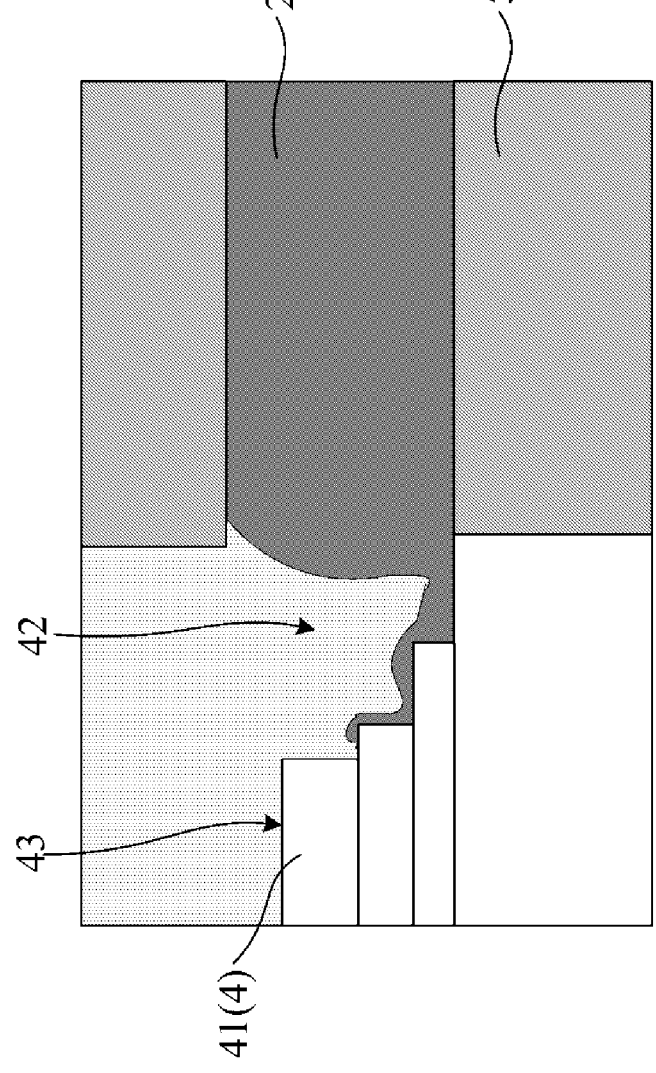
FIG. 6 shows the schematic diagram of the semiconductor structure shown in FIG. 5 after thermocompression bonding.

Through the thermocompression bonding process, the solder layer 2 infiltrates the surface of the pad 5, thereby interconnecting with the pad 5. After the temperature is lowered, effective solder joints can be formed. Referring to FIG. 6, it should be noted that during the process of thermocompression bonding, if there is no barrier layer 4 to block the solder, part of the solder may be separated from the original solder layer 2, therefore, the final formed effective solder The volume of the spot may be reduced, thereby increasing the resistance of the effective solder joint, thereby affecting the operating rate of the semiconductor structure. Under the blocking effect of the barrier layer 4, even if the solder undergoes a certain deformation and flow after heating up, the solder can still be concentrated in the opening 42, thereby reducing the amount of solder detached from the main body of the solder layer 2, and finally forming effective solder joints. The volume will not be significantly reduced, thereby ensuring that the resistance of the effective solder joint is within a small range, thereby reducing the time delay and energy consumption of the semiconductor structure.

In addition, with reference to FIGS. 4-8, the structural member 6 may also have a soldering pad 5, which may be electrically connected to elements in the structural member 6, and protruded on the surface of the structural member 6.

The solder layer 2 is located between the two solder pads 5, thereby realizing the electrical connection between the structural member 6 and the carrying layer 1. For example, the material of the pad 5 may be copper, aluminum and other metals, and the material of the solder layer 2 may be tin.

In some embodiments, referring to FIG. 4 and FIG. 7, the carrying layer 1 may be a wafer 11, that is, the material of the carrying layer 1 may include silicon. For example, the wafer 11 may include a plurality of second chips, and after the adhesive layer 3 is laminated on the surface of the wafer 11, the wafer 11 is diced to obtain a plurality of separate second chips. The second chip and the first chip are stacked and bonded, so that a chip stack can be obtained, thereby improving the integration degree of the semiconductor structure. The second chip may be the same as the first chip, for example, both are memory chips. The second chip may also be different from the first chip, for example, one of the two is a memory chip, and the other of the two is a logic chip.

In other embodiments, referring to FIG. 8, the carrier layer 1 may be a substrate, such as the first substrate 12. That is to say, the upper and lower sides of the solder layer 2 can be electrically connected to two chips or two substrates respectively, or the upper side of the solder layer 2 can be electrically connected to one of the chip and the substrate, and the lower side of the solder layer 2 can be electrically connected to the other chip and the substrate.

The first substrate 12 can provide functions such as electrical connection, protection, support, heat dissipation, assembly, etc. for the structural member 6 such as the first chip, so as to achieve purposes such as reducing the volume of packaged products, improving electrical properties, and increasing density. The first substrate 12 may be composed of a conductive layer and an insulating layer, and the conductive layers are separated by an insulating layer. Materials for constituting the first substrate 12 may include resin, ceramics, copper foil, and the like.

In some embodiments, referring to FIGS. 4-8, the adhesive layer 3 may be a non-conductive film (NCF) or a non-conductive paste (non NCP). The non-conductive adhesive film exists in the form of a film, so the non-conductive adhesive film is laminated on the carrier layer 1 before thermocompression bonding. In order to improve the reliability of the electrical interconnection and to reduce the adverse effect of the fluidity of the adhesive layer 3 on the solder layer 2, non-conductive adhesive films of different thicknesses can be configured for the solder layer 2 of different heights. The non-conductive paste can be formed on the carrying layer 1 by coating. Silicon oxide particles can be added to the non-conductive paste, thereby increasing the viscosity and Young's modulus of the adhesive layer 3, thereby improving assembly reliability. In addition, particles for heat conduction can also be added to the non-conductive paste, thereby improving the heat dissipation performance of the semiconductor structure.

With reference to FIG. 4-FIG. 7, when carrying layer 1 is wafer 11, barrier layer 4 can be the passivation layer of pad 5, and the material of barrier layer 4 can be selected silicon oxide, silicon nitride, oxynitride passivation materials such as silicon. Exemplarily, a chemical vapor deposition process is used to form a passivation material layer on the surface of the wafer 11 the passivation material layer is patterned multiple times to form the steps 43. For example, the passivation material layer is etched to form the step 43. The aforementioned process for forming the step 43 has high reliability and stability, so the number of layers of the step 43 can be appropriately increased, thereby improving the effect of blocking the adhesive layer 3 and the solder layer 2. Exemplarily, the sub-barrier layer 41 is at least three layers. In some other embodiments, the number of sub-barrier layers 41 may be less than five layers, which is beneficial to simplify the production process and reduce the production cost.

Referring to FIG. 8, when the carrier layer 1 is the first substrate 12, the material of the barrier layer 4 can be green oil, that is, liquid photo solder resist. The green oil can be formed on the surface of the first substrate 12 by screen printing, exposure and development, curing and other processes. Since the formation process of the barrier layer 4 of green oil material is more complicated than that of the barrier layer 4 of passivation material, the number of sub-barrier layers 41 of green oil material may be less than the number of sub-barrier layers 41 of passivation material. For example, when the material of the barrier layer 4 is green oil, the sub-barrier layer 41 has at least two layers. In other embodiments, in order to simplify the production process and improve pattern accuracy, the number of sub-barrier layers 41 may be less than three layers.

Figure 9:
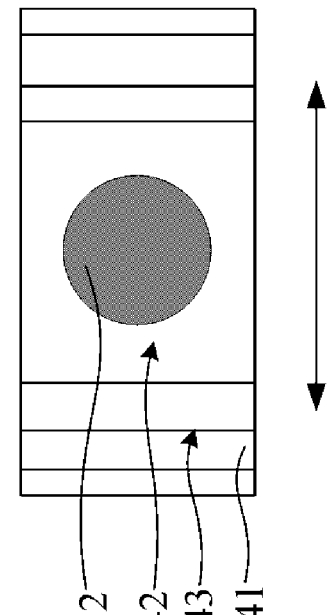
FIGS. 9-10 respectively show top views of different steps of semiconductor structures provided by an embodiment of the present disclosure.

Referring to FIG. 9, in some embodiments, the steps 43 may be located on opposite sides of the opening 42. For example, the arrangement direction of the steps 43 on opposite sides of the opening 42 may be parallel to the flow direction of the adhesive layer 3, so as to improve the blocking effect of the steps 43 on the adhesive layer 3 and solder. The arrows in FIG. 9 show the flow direction of the adhesive layer 3. In some embodiments, the sidewalls of the sub-barrier layers 41 on opposite sides of the opening 42 may be aligned, that is, the sidewalls of the barrier layers 4 on the opposite sides of the opening 42 are relatively flat. In this way, the surroundings of the opening 42 are closed by the barrier layer 4, which is beneficial to improve the barrier effect.

In some embodiments, the steps 43 located on opposite sides of the opening 42 are arranged symmetrically with respect to the center of the opening 42, which is beneficial to improving the uniformity of the semiconductor structure, and the production process is simpler. In addition, the symmetrically arranged steps 43 are also beneficial to balance the blocking effect on solder.

Figure 10:
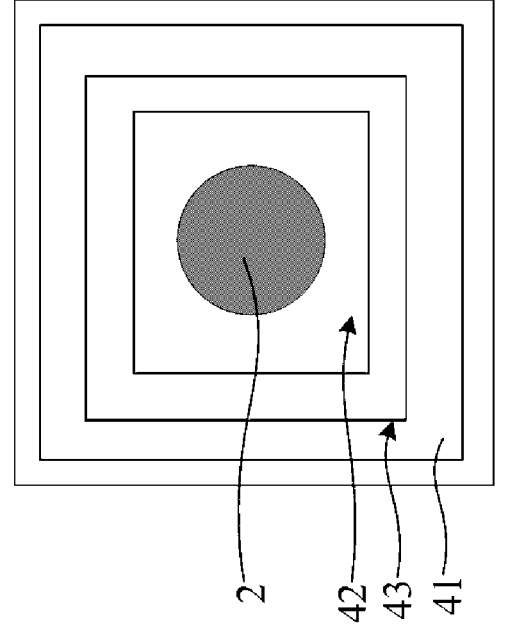

Referring to FIG. 10. in some embodiments, a step 43 surrounds the opening 42. In this way, the fluidity of the adhesive layer 3 and the solder can be reduced from all directions, thereby preventing the solder from escaping from one opening 42 into another opening 42 or between adjacent openings 42.

In addition, the step 43 surrounding the opening 42 may be symmetrical to the center of the opening 42. In this way, it is beneficial to simplify the production process and ensure that the steps 43 everywhere can effectively block the adhesive layer 3 and solder.

In some embodiments, in the direction perpendicular to the upper surface of the carrying layer 1, the thickness of the multiple sub-barrier layers 41 is the same. Therefore, it is beneficial to unify the process parameters, the production process is simpler, and the production cost is lower.

Referring to FIG. 5-FIG. 8, in some other embodiments, in the direction in which the carrier layer 1 points to the barrier layer 4, the thickness of the sub-barrier layer 41 increases sequentially. In this way, the closer to the top of the opening 42. the more difficult it is for the solder layer 2 to pass over the sub-barrier layer 41, so that the barrier effect can be improved. It should be noted that, referring to FIGS. 5-7. when the material of the barrier layer 4 is a passivation material such as silicon oxide, the bottom barrier layer 4 may not satisfy the above-mentioned rule, for example, the bottom barrier layer 4 may have a maximum thickness. That is to say, in the direction from bottom to top, the thickness of the sub-barrier layers 41 that are not the bottommost layer increases sequentially. The main reason is that it is easier to control the thickness of the barrier layer 4 by using the chemical vapor deposition process. Therefore, the bottom barrier layer 4 can be made thicker, thereby providing more sufficient filling space for the solder pad 5, so as to reduce the thickness of the solder pad 5. resistance.

Figure 5:
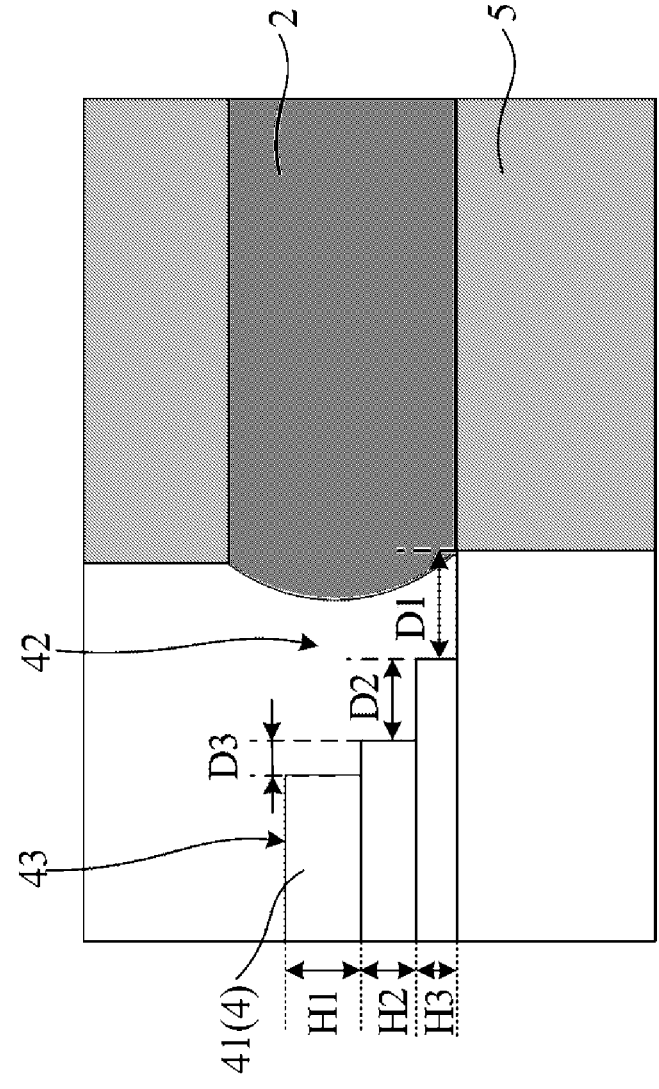
FIG. 5 shows the partially enlarged view of the semiconductor structure shown in FIG. 4.

In some embodiments, referring to FIG. 5, the thickness H3 of the passivation layer of the third layer, the thickness H2 of the passivation layer of the second layer, and the thickness H1 of the passivation layer of the first layer increase sequentially. Referring to FIG. 8, the thickness L2 of the green oil of the second layer is smaller than the thickness L1 of the green oil of the first layer. The afore-mentioned first passivation layer refers to the topmost pas-sivation layer, and the aforementioned first layer of green oil refers to the topmost green oil.

Referring to FIGS. 4-8. in some embodiments, the top surface of the solder layer 2 is higher than the top surface of the barrier layer 4. That is, the solder layer 2 has a larger thickness, which is beneficial to reduce the resistance of the solder layer 2 and improve the firmness of soldering. In addition, the larger thickness of the solder layer 2 is also conducive to increasing the distance between the first chip and the carrying layer 1, thereby increasing the heat dissi-pation space of the first chip to improve the heat dissipation speed.

In some embodiments, in a direction perpendicular to the upper surface of the carrier layer 1, the height difference between the top surface of the solder layer 2 and the top surface of the barrier layer 4 is smaller than the thickness of the sub-barrier layer 41. Exemplarily, the height difference between the solder layer 2 and the top surface of the barrier layer 4 is smaller than the thickness of the sub-barrier layer 41 having the smallest thickness. It should be noted that, if the height difference between the solder layer 2 and the top surface of the barrier layer 4 is too large, the adhesive layer 3 and the solder may have greater fluidity, thereby over-coming the topmost step 43. When the height difference between the two is smaller than the thickness of the sub-barrier layer 41. it is beneficial to ensure the barrier effect and prevent solder from flowing into other openings 42 or between adjacent openings 42.

In another embodiment, if the barrier layer 4 is a passi-vation layer such as silicon oxide, the top surface of the solder layer 2 can also be flush with the top surface of the barrier layer 4. That is, the chemical vapor deposition process is easier to control the thickness of the barrier layer 4. therefore, the thickness of the barrier layer 4 can be increased accordingly to improve the barrier effect of the barrier layer 4. Referring to FIG. 8. if the barrier layer 4 is made of green oil, the top surface of the barrier layer 4 may be lower than the top surface of the solder layer 2. The reason is that the barrier layer 4 of the green oil material needs to be formed through steps such as printing, exposure, development, and curing. If the thickness of the barrier layer 4 is too large, it is not conducive to improving the reliability of the above steps. Therefore, the green oil should be appropriately reduced. The thickness of the barrier layer 4 of the material is used to improve the film quality of the barrier layer 4 and improve the precision of the pattern.

Referring to FIGS. 4-7, except for the topmost step 43, the lengths of the upper surfaces of the remaining steps 43 increase sequentially in the direction from the outside of the opening 42 to the inside of the opening 42. That is to say, except for the topmost step 43. the lengths of the upper surfaces of the lower steps 43 increase sequentially. It should be noted that the upper surface of the step 43 can be understood as: the upper surface of a sub-barrier layer 41 exposed by the upper sub-barrier layer 41; in addition, the length of the upper surface of the step 43 can also be understood as the distance between the two adjacent side walls of the step 43. For example, referring to FIG. 5. the width D3 of the upper surface of the second step 43. the width D2 of the upper surface of the third step 43. and the width D1 of the upper surface of the fourth step 43 increase sequentially.

It should be noted that the longer the upper surface of the lower step 43, the stronger its ability to accommodate solder, so that more of the solder that flows in the opening 42 can be concentrated on the bottom of the opening 42, avoiding solder over the top of the opening 42 and flows into other openings 42 or between adjacent openings 42.

Except the step 43 of the top layer, the length of the upper surface of the step 43 of the top layer is shorter, that is, the step 43 of the top layer is steeper, thereby the tendency of the adhesive layer 3 and solder to flow downward can be strengthened, and then there is It is beneficial to reduce the pores in the adhesive layer 3 at the bottom of the opening 42 and improve the effect of blocking solder.

In other embodiments, except for the topmost step 43, the lengths of the upper surfaces of the remaining steps 43 may also be the same in the direction from the outside of the opening 42 to the inside of the opening 42. In this way, it is beneficial to simplify the production process.

With reference to FIG. 4-FIG. 7, when the material of barrier layer 4 is passivation material, except the sub-barrier layer 41 of bottommost layer, the distance of all the other sub-barrier layers 41 and soldering pad 5 is greater than the diameter of solder layer 2 one third. Referring to FIG. 8. since the total thickness of the barrier layer 4 made of the green oil material is small, the distance between the barrier layer 4 and the solder pad 5 can be appropriately increased. For example, when the material of the barrier layer 4 is green oil, except for the bottommost sub-barrier layer 41. the distance between the sub-barrier layer 41 and the solder pad 5 is greater than half of the diameter of the solder layer 2. That is, the distance between the non-lowest sub-barrier layers 41 and the pad 5 is greater than half of the diameter of the solder layer 2.

It should be noted that if the distance between the sub-barrier layer 41 and the soldering pad 5 is too close, the accommodation space in the opening 42 will be reduced, and the solder may escape from the opening 42; if the distance between the sub-barrier layer 41 and the soldering pad 5 is too large, The distance between adjacent solder layers 2 may be increased, which may result in waste of space, which is not conducive to reducing the volume of the semiconductor structure. Controlling the distance between the sub-barrier layer 41 and the soldering pad 5 according to the diameter of the solder layer 2 can ensure a relatively sufficient accommodation space for the solder, and can also improve the utilization efficiency of the space.

Referring to FIG. 4 and FIG. 7, when the barrier layer 4 is a passivation layer such as silicon oxide, the upper surface of the soldering pad 5 can be flush with the upper surface of the bottom sub-barrier layer 41, thus, the production process is more efficient. Simple, the protective effect of the sub-barrier layer 41 on the pad 5 can also be enhanced. In some other embodiments, the upper surface of the solder pad 5 may be lower than the upper surface of the bottommost sub-barrier layer 41. so as to increase the accommodation space for solder and prevent the solder from escaping the opening 42. In some other embodiments, the upper surface of the solder pad 5 can also be higher than the upper surface of the bottom sub-barrier layer 41, so that the melted solder can also cover the sidewall of the solder pad 5, which is beneficial to increase the contact between the solder and the contact area of the pad 5, thereby reducing the contact resistance.

With reference to FIG. 8, when barrier layer 4 is green oil, because soldering pad 5 forms earlier than the green oil of the bottom layer, thus the upper surface of soldering pad 5 can be flush with the upper surface of the sub-barrier layer 41 of the bottom layer The upper surface of the sub-barrier layer 41 is flat or lower than the bottommost layer. That is to say, in the direction that the carrier layer 1 points to the barrier layer 4. the thickness of the bottommost sub-barrier layer 41 may be greater than or equal to the thickness of the solder pad 5. In this way, it is beneficial to simplify the production process and ensure the blocking effect of the step 43.

In summary, the semiconductor structure provided by the embodiment of the present disclosure can adopt the mode of TCB to stack chips, and adopt the adhesive layer 3 such as NCF to fill the gap between the first chip and the carrier layer 1, thereby improving the semiconductor structure. the strength of the structure. The barrier layer 4 of the soldering pad 5 is designed in a stepped manner to slow down the fluidity of the adhesive layer 3. while the melted solder is bound in the opening 42 in the barrier layer 4. It is difficult for the solder to pass over the stepped barrier layer 4. so as to prevent the solder from flowing to other places, thereby avoiding the defect of short circuit.

As shown in FIGS. 4-10, another embodiment of the present disclosure provides a method for manufacturing a semiconductor structure, which can be used to manufacture the semiconductor structure improved in the foregoing embodiments. Detailed description of the semiconductor structure Reference may be made to the foregoing embodiments, and details are not repeated here.

The manufacturing method of semiconductor structure comprises: provide carrier layer 1; form barrier layer 4 on the surface of carrier layer 1, have opening 42 in barrier layer 4; barrier layer 4 comprises the multiple sub-barrier layer 41 of lamination arrangement, multiple sub-barrier layer 41 forms a plurality of steps 43 at the opening 42, and the height of the plurality of steps 43 decreases sequentially in the direction from the inside of the opening 42 to the outside of the opening 42; the solder layer 2 is formed in the opening 42; the solder layer 2 is formed in the opening 42 An adhesive layer 3 covering the solder layer 2.

The manufacturing method will be described in detail below.

Example one, with reference to FIG. 4, the carrying layer 1 is wafer 11, and barrier layer 4 is passivation layer, and the concrete steps of manufacturing method can comprise:

First adopt chemical vapor deposition process to deposit the first passivation material layer on the upper surface of wafer 11, etch the first passivation material layer, thereby form a groove in the first passivation material layer, the passivation material layer serves as the bottommost sub-barrier layer 41. Metal is deposited in the grooves as pads 5. after which chemical mechanical polishing is performed so that the top surface of the first passivation material layer is flush with the top surface of pads 5.

Thereafter, another layer of passivation material layer is deposited, and the passivation material layer is patterned; thereafter, a sacrificial layer is deposited in the passivation material layer. The aforementioned steps of depositing a passivation material layer, patterning and depositing a sacrificial layer are repeated. Afterwards, all the sacrificial layers are removed, thereby exposing the opening 42 with a step 43 there. The precision of the step 43 formed by the above method is relatively high.

It should be noted that, in some other embodiments, the method for forming the step 43 may also include: depositing a second passivation material layer on the first passivation material layer, forming a mask on the second passivation material layer film layer. The mask layer has a small first gap, and a partial thickness of the second passivation material layer is etched along the first gap. Thereafter, the first notch is enlarged to form a second notch, and the second passivation material layer with a partial thickness is continuously etched along the second notch. Thereafter, the second notch is enlarged to form a third notch, and the second passivation material layer is etched along the third notch. This step needs to penetrate the second passivation material layer, thereby exposing the top surface of the soldering pad 5 and A portion of the top surface of the first passivation material layer. Thereby, a plurality of steps 43 can be formed. That is, the above method can integrate multiple deposition processes in the same step, and does not need to form a sacrificial layer, thereby facilitating the simplification of the production process.

After the step 43 is formed, the adhesive layer 3 is formed on the entire front surface of the wafer 11 by lamination or spin coating. Thereafter, a dicing film is pasted on the back surface of the wafer 11, and then the wafer 11 is diced into individual second chips. The solder layer 2 is formed on the surface of the structural member 6, and the surface of the structural member 6 with the solder layer 2 faces the second chip, and finally, the interconnection between the structural member 6 and the second chip is realized by thermocompression bonding. After thermocompression bonding, the adhesive layer 3 is cooled and solidified. In other words, the adhesive layer 3 is formed on the carrying layer 1 by using the preformed underfill technology, and the structural member 6 is bonded to the second chip by flip-chip welding. It should be noted that the adhesive layer 3 can be made of a material with high mechanical strength and good stability, so as to meet the requirements of the scribing process.

The aforementioned process is beneficial to meet the requirements of narrow pitch of the semiconductor structure, and is also beneficial to improve production efficiency and reduce holes generated during underfilling, thereby improving the reliability of electrical interconnection.

Example two, with reference to FIG. 8, carrying layer 1 is the first substrate 12, and barrier layer 4 is green oil, and the concrete steps of manufacturing method can comprise:

First, a metal layer is formed on the first substrate 12 by means of electroplating, and then the metal layer is patterned by etching to form pads on the surface of the first substrate 12. Thereafter, wet green oil is applied on the first substrate 12, and the wet green oil may also cover the pads. The solvent in the wet green oil is evaporated at low temperature to make it harden initially.

The negative film is pasted on the first substrate 12 to carry out the exposure process, and the exposure process can adopt ultraviolet light to irradiate the green oil. Thereafter, a developing process is performed. For example, in the exposure process, the green oil with the light-shielding area is washed away, thereby exposing the pad; in the exposure process, the green oil without the light-shielding area is retained. Thereafter, the green oil can be cured by ultraviolet irradiation or heating and drying, thereby forming the lowest sub-barrier layer 41.

Repeat the aforementioned steps of applying wet green oil, exposing, developing, and curing to form the sub-barrier layer 41 of the top layer. In the exposure process for forming the sub-barrier layer 41 of the top layer, the area provided with the light-shielding region is larger, so that a step 43 can be formed at the opening 42.

In summary, a stepped barrier layer 4 is formed on the carrier layer 1, and the solder layer 2 is embedded in the opening 42 of the barrier layer 4, so that the fluidity of the adhesive layer 3 and the solder can be slowed down, and then reduced. Risk of short circuits in semiconductor structures.

In the description of this specification, descriptions with reference to the terms "some embodiments", "example" and the like mean that the specific features, structures, materials or characteristics described in conjunction with the embodiments or examples are included in at least one of the present disclosure Examples or examples. In this specification, the schematic representations of the above terms are not necessarily directed to the same embodiment or example. Furthermore, the described specific features, structures, materials or characteristics may be combined in any suitable manner in any one or more embodiments or examples. In addition, those skilled in the art can combine and combine different embodiments or examples and features of different embodiments or examples described in this specification without conflicting with each other.

Although the embodiment of the present disclosure has been shown and described above, it can be understood that the above embodiment is exemplary and cannot be construed as a limitation of the present disclosure, those of ordinary skill in the art can make changes, modifications, substitutions and modifications to the above-mentioned embodiments within the scope of the present disclosure. Any changes or modifications made according to the claims and description of the present disclosure shall fall within the scope covered by the patent of the present disclosure.

The invention claimed is:

1. A semiconductor structure, comprising:
   a carrying layer, a barrier layer disposed on a surface of the carrying layer, wherein the barrier layer comprises an opening inside;
   wherein the barrier layer comprises multiple sub-barrier layers in a stack, wherein the multiple sub-barrier layers respectively form a plurality of steps in the opening, and
   wherein in a direction pointing from an outside of the opening to an inside of the opening, heights of the plurality of plurality of steps decrease sequentially;
   a solder layer and an adhesive layer disposed inside the opening, wherein the adhesive layer covers the solder layer;
   wherein the carrying layer is a first substrate, and wherein the multiple sub-barrier layers comprise at least two layers;
   wherein the surface of the carrying layer further comprises a soldering pad, wherein the soldering pad is located in the bottommost layer of the multiple sub-barrier layers;
   wherein, except for the bottommost layer of the multiple sub-barrier layers, a distance between each of rest of the multiple sub-barrier layers and the soldering pad is greater than a half of a diameter of the solder layer.

2. The semiconductor structure according to claim 1, wherein the multiple sub-barrier layers have a same thickness; or, thicknesses of the multiple sub-barrier layers increase sequentially in a direction where the carrying layer points to the barrier layer.

3. The semiconductor structure according to claim 1, the plurality of steps is located on opposite sides of the opening.

4. The semiconductor structure according to claim 3, wherein the plurality of steps surrounds the opening.

5. The semiconductor structure according to claim 1, wherein the carrying layer comprises a wafer, and wherein the multiple sub-barrier layers comprise at least three layers.

6. The semiconductor structure according to claim 5, wherein a top surface of the solder layer is higher than a top surface of the barrier layer, or the top surface of the solder layer is flush with the top surface of the barrier layer.

7. The semiconductor structure according to claim 6, wherein a height difference between the top surface of the solder layer and the top surface of the barrier layer is smaller than a thickness the multiple sub-barrier layers.

8. The semiconductor structure according to claim 1, except for a topmost step, in the direction pointing from the outside of the opening to the inside of the opening, lengths of upper surfaces of the plurality of steps increase sequentially.

9. The semiconductor structure according to claim 1, wherein in the direction which the carrying layer points to the barrier layer, a thickness of the bottommost sub-barrier layer is greater than or equal to a thickness of the soldering pad.

10. The semiconductor structure according to claim 1, wherein a sidewall of the bottommost sub-barrier layer of the multiple sub-barrier layers is in contact with a sidewall of the soldering pad.

11. The semiconductor structure according to claim 1, further comprising: a structural member, wherein the structural member is located over the carrying layer and is electrically connected with the solder layer; wherein the adhesive layer fills between the structural member and the carrying layer; and wherein the structural component comprises a chip or a second substrate.

12. A method for manufacturing a semiconductor structure, comprising:
   providing a carrying layer;
   forming a barrier layer on a surface of the carrying layer, and forming an opening in the barrier layer, wherein the barrier layer comprises multiple sub-barrier layers in a stack; forming a plurality of steps from the multiple layers of the sub-barrier layer in the opening, wherein heights of the plurality of steps are successively reduced in a direction pointing from an inside of the opening to an outside of the opening;
   forming a solder layer within the opening; and
   forming an adhesive layer covering the solder layer in the opening;
   wherein the carrying layer is a first substrate, and wherein the multiple sub-barrier layers comprise at least two layers;
   wherein the surface of the carrying layer further comprises a soldering pad, wherein the soldering pad is located in a bottommost layer of the multiple sub-barrier layers;
   wherein, except for the bottommost layer of the multiple sub-barrier layers, a distance between each of rest of the multiple sub-barrier layers and the soldering pad is greater than a half of a diameter of the solder layer.

\* \* \* \* \*